Jan. 12, 1971 C. E. KEENE 3,554,876

PROCESS FOR ETCHING AND ELECTROPLATING A PRINTED CIRCUIT

Filed Jan. 29, 1968

INVENTOR.
CARL E. KEENE,
BY
Allen A. Dicke, Jr.,
AGENT.

3,554,876

PROCESS FOR ETCHING AND ELECTRO PLATING A PRINTED CIRCUIT

Carl E. Keene, Huntington Beach, Calif., assignor to Hughes Aircraft Company, Culver City, Calif., a corporation of Delaware Filed Jan. 29, 1968, Ser. No. 701,194
Int. Cl. C23b 5/48
U.S. Cl. 204—15 3 Claims

ABSTRACT OF THE DISCLOSURE

An insulative substrate has at least one continuous metal layer secured thereon, which metal layer is to be etched away to form separate circuit elements. Electroplating of additional metal is accomplished before such etching so that the continuous metal layer can act as a cathode during the electroplating process. Thereafter, portions of the metal layer are etched away to define separate circuit elements.

BACKGROUND OF THE INVENTION

This invention relates to the art of forming etched and electroplated electric circuits, such as printed circuits.

The prior art abounds with processes for the etching of conductor metal on insulative substrates. Each of these is of concern in the field of printed circuits. More involved techniques are being used with the miniaturization of such printed circuitry. Such miniaturization goes to the point where microscopes are necessary to examine the details of circuit elements. Furthermore, printed circuits are now being formed from multiple layers of conductors upon insulative substrates, the multiple layers being utilized for different amounts of resistance between parts of the circuit. However, these greatly miniaturized circuits provide problems in interconnection with other circuitry. The interconnection problem is solved by electroplating connection pads upon the printed circuit, and soldering or welding a wire to such pads. On the other hand, sometimes these pads are used for spot welding to adjacent printed circuits. The formation of these pads has been accomplished by electroplating the pads onto the already etched printed circuits. This has led to involved difficulties, especially in making the cathodic connections to the printed circuit.

SUMMARY

It can be stated in essentially summary form that this invention is directed to the selective electroplating of pads onto a printed circuit laminated structure before all of the metal lamina are etched away to final form, but when at least one of the metal lamina extends substantially over the entire printed circuit area. In this way, the continuous metal lamina is used as a cathodic electric connection. After electroplating is completed, that metal lamina used for the cathodic electrical connection is etched away into final form.

It is thus an object of this invention to provide a process wherein electroplating is accomplished upon a metal element of a printed circuit structure before the metal element is etched into its final form so that the metal element can act as a cathodic interconnection. It is a further object of this invention to plate directly upon the metallic interconnectors of a printed circuit without an intermediate film. It is a further object of this invention to provide a process where at least two layers of conducting material are laminated upon an insulative substrate in a printed circuit structure. Other objects and advantages of this invention will become apparent from a study of the following portions of the specification, the claims and the attached drawings.

BRIEF DEECRIPTION OF THE DRAWINGS

DESCRIPTION OF THE PREFERRED EMBODIMENT

Figure 1:
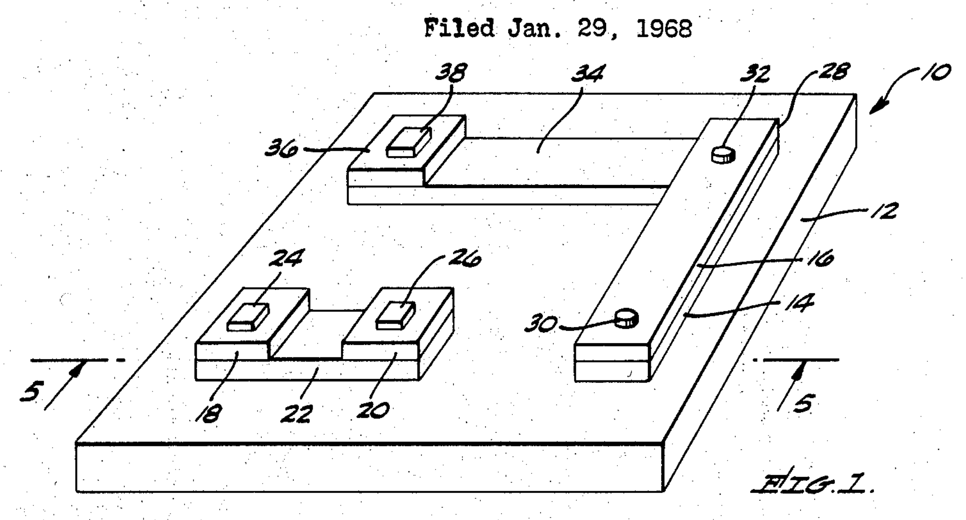
FIG. 1 is an isometric view of a finished printed circuit board produced in accordance with the process of this invention.

Referring to FIG. 1, the printed circuit board 10 which is the illustrative end product of the process of this invention is shown therein. The printed circuit board 10 comprises an insulative substrate 12. The substrate 12 may be of any convenient insulative material which is sufficiently rigid for the purpose and to which a metallic layer can be bonded. In the larger printed circuit boards, these are conventionally filled synthetic polymer composition materials. However, for the miniaturized printed circuit boards, or chips, the substrate 12 is usually of alumina. Furthermore, in some cases the alumina is plain, while in others it is provided with a ceramic glaze on the top surface.

This process is also employed on silicon wafers which have had diffusion processes performed on them to construct transistor and diode junctions and also complete integrated circuits to which mounting bumps and pads are desired.

As is seen in the figures, a first layer 14 of conductor is laminated to the top surface of substrate 12. The first layer 12 is conveniently of chromium evaporated onto the surface. Chromium or Nichrome is preferred, because it bonds well to the alumina substrate and accepts other materials on the top thereof with tight bonding. The chromium is evaporated onto the surface in such a thickness that its resistance is in the order of 100 ohms per square. When a printed circuit board incorporating resistances is desired, instead of using chromium as this first layer 14, a Nichrome alloy is preferred because of its superior resistance characteristics. However, Nichrome alloys also bond well to alumina insulation substrates. When the substrate has an alumina top surface, an alloy having approximately 80 percent nickel and 20 percent chromium is preferred. However, when the substrate 12 has a ceramic glazed top surface, an alloy of approximately 70 percent nickel and 30 percent chromium is preferred because of its superior adhesion to a glazed surface. For resistance purposes, when Nichrome is used as a layer 14, it is deposited to a thickness in the order of 250 ohms per square. Deposition of the chromium or Nichrome is accomplished by conventional evaporation techniques.

Upon the first layer 14 is deposited the second layer 16. The second layer 16 is considered to be the layer from which the primary conductors of the printed circuit will be formed. The second layer 16 can be of any convenient conductive material that bonds upon the first layer, and which is of suitable characteristics. A layer of gold evaporated into place is preferred in the miniaturized circuit board or chip of this invention, because of its bondability, its conductivity and because it can be deposited by the usual evaporation techniques. The second layer 16 is deposited to such thickness that it has a resistance in the order of 0.1 ohm per square.

Figure 5:
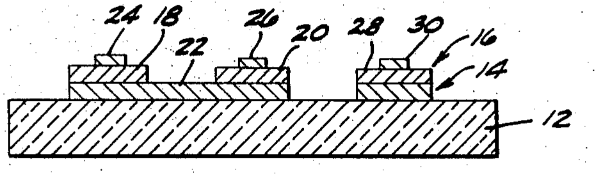
FIG. 5 is a reduced section through the finished printed circuit board, taken generally along the line 5—5 of FIG. 1.

Referring principally to FIGS. 1 and 5, which show the finished printed circuit board, it is seen that the layers 14 and 16 are etched to a particular configuration to define different circuits. Bosses 18 and 20 formed of layer 16 are left upon a strip 22 of layer 14. Thus, there is a conductive path between bosses 18 and 20 through strip 22, and the resistance is a function of the cross sectional area and length of strip 22. Connecting pads 24 and 26 are deposited upon the top of bosses 18 and 20, respectively, for connection to other circuit parts. An electrically separate circuit is also formed on substrate 12 by strip 28 which extends from connection pad 30 to connection pad 32. Additionally, strip 34 extends from beneath strip 28, and is formed of the material of first layer 14. On the end of strip 34 is a boss 36 on which is formed connection pad 38. This structure is accomplished by the process described below.

Figure 2:
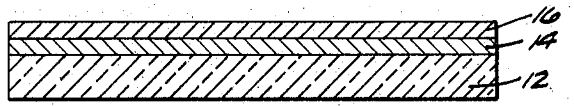
FIG. 2 is a reduced section through the starting structure.

Referring to FIG. 2, the starting structure of the printed circuit board 10 is illustrated. It comprises the previously described substrate 12, the first layer 14 of chromium or Nichrome, and second layer 16 of conductive material such as gold. As described, these are preferably successively evaporated to build up the structure as shown.

Figure 3:
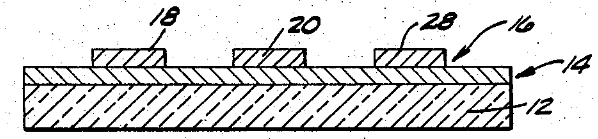
FIG. 3 is a reduced section through the printed circuit board at an intermediate stage of the process.

The next step in the process comprises applying a suitable photoresist to the top of the second layer 16, optically exposing the photoresist, and developing it as necessary. The photoresist should be of such character as to be resistant to a solution which etches away the unprotected gold. The next step is to etch away the unprotected gold to resolve in the structure shown in FIG. 3. This etching is accomplished by application of a suitable etchant. A suitable etchant is "Metex Aurostrip" manufactured by MacDermid, Inc. of Waterbury, Conn. This is an etchant of potassium cyanide base and incorporates suitable inhibitors.

After the gold layer is etched to a suitable configuration, the photoresist is stripped and reapplied. After reapplication, it is exposed to provide openings at the points where connection pads are desired. The photoresist is developed as necessary, and the structure is put in a suitable electroplating bath. The photoresist of this step of the process is illustrated at 40 in FIG. 4.

Figure 4:
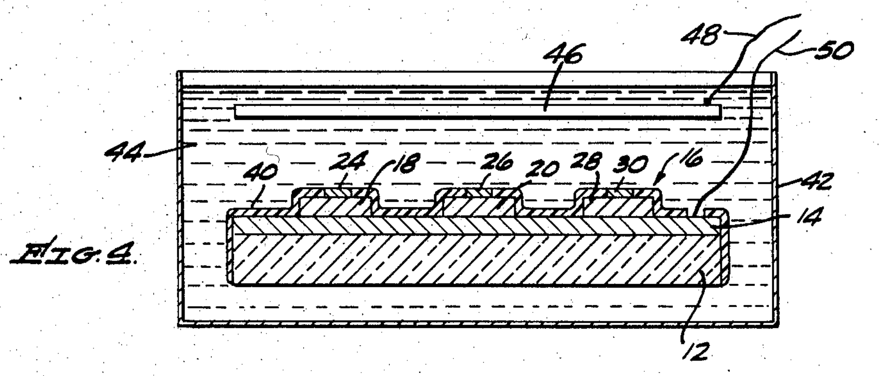
FIG. 4 is another reduced section taken through the printed circuit board at an intermediate stage, showing the electroplating step.

FIG. 4 illustrates a plating bath vessel 42 which contains electroplating solution 44. The partially completed printed circuit board 10 is inserted into the electroplating solution together with an anode 46. Electric connection is made to the anode 46 by means of lead 48 and is made to first layer 14 by means of lead 50. The first layer 14 is continuous under all of the bosses and strips thereon, so that the connection of lead 50 to layer 14 is a connection to the complete cathodic structure. In this step of the process connection pads 24, 26 and 30, as well as the other connection pads are electroplated onto the tops of the bosses and strips. The plating is preferably of silver for ease of soldering and welding to the connection pads, although other metals, such as nickel, tin, copper, as well as alloys may be used. Plating is accomplished by a standard plating solution, and in the preferred case a standard high speed silver plating bath. Plating continues until a sufficient deposit is obtained upon the connection pads for appropriate soldering and/or welding. It is also possible to plate additional layers, or successive layers of different metals, i.e., a first layer of copper, then tin, or silver then tin, or nickel then copper then tin, etc., as in standard electroplating of the many and varied laminates.

After the plating of the connection pads, the mask is stripped, and the structure is coated with a new layer of photoresist. Now, the photoresist is exposed through a suitable mask to define the area of the resistors which are intended to remain. These are strips 22 and 34 in FIG. 1. Any suitable resistor configuration can be used, depending upon the desired resistance value. If higher resistance is desired, longer convoluted resistance paths can be employed. Thereupon, chrome etchant is used to remove the exposed areas of layer 14. Exposed areas are those which are not protected by the photoresist and which are not protected by the presence of the second layer 16. A conventional chromium etch is used, which is also useful on the Nichrome alloys. The usual chromium etch is potassium permanganate to oxidize the exposed chromium, followed by sodium thiosulfate to remove the oxide layer. After the chromium etch has been completed to completely remove the chromium or Nichrome first layer 14 down to the top surface of substrate 12 in the unexposed areas, the last mask is stripped and the printed circuit board 10 is completed. It is ready for such further processing such as the attachment of leads to the connection pads or the welding of the printed circuit board to another structure by means of the connection pads.

This invention having been described in its preferred embodiment, it is clear that it is susceptible to numerous modifications and embodiments within the ability of those skilled in the art and without the exercise of the inventive faculty. Accordingly, the scope of this invention is defined by the scope of the following claims.

What is claimed is:

1. The process for producing an etched printed circuit having a pattern comprising the steps of:

providing an insulative alumina substrate having a surface on which the printed circuit is to be supported and secured;

vapor-depositing in vacuum a first layer of metal selected from the group consisting of chromium and chromium alloys onto a substantial area on the surface of the substrate, extending at least beyond the limits of the printed circuit pattern;

depositing a layer of noble metal onto the first layer, with the layer of noble metal extending at least as large as the printed circuit pattern;

selectively etching away a portion of this noble metal layer to define the conductive pattern of the printed circuit by the layer of noble metal remaining;

electroplating pads on selected areas of the remaining noble metal layer through the use of a mask which limits plating to the selected areas and by electrical connection to the first layer as cathodic interconnection for electroplating the pads; and etching away selected areas of the first layer down to the substrate through the use of an etch-resistant mask so that remaining portions of the first layer interconnect some of the remaining portions of the noble metal layer as electrically resistive connections.

2. The process of claim 1 wherein the step of depositing the second layer comprises evaporating a metal selected from the group consisting of the noble metals onto at least a portion of the first layer.

3. The process of claim 1 wherein the depositing step is accomplished by electroplating a metal selected from the group consisting of the noble metals onto at least a portion of the first layer.

References Cited

UNITED STATES PATENTS

| | | | |
|---|---|---|---|
| 2,958,928 | 11/1960 | Bain, Jr. et al. | 204—15 |
| 3,387,952 | 6/1968 | Chapelle | 156—7 |
| 3,388,048 | 6/1968 | Szabo, Jr. | 204—15 |
| 3,408,271 | 10/1968 | Reissmueller et al. | 204—15 |
| 3,462,349 | 8/1969 | Gorgenyi | 204—15 |

JOHN H. MACK, Primary Examiner

T. TUFARIELLO, Assistant Examiner